US012648640B2

(12) United States Patent
Chen et al.

(10) Patent No.: US 12,648,640 B2
(45) Date of Patent: Jun. 9, 2026

(54) SLIDE RAIL ASSEMBLY

(71) Applicants: King Slide Works Co., Ltd., Kaohsiung City (TW); King Slide Technology Co., Ltd., Kaohsiung City (TW)

(72) Inventors: Ken-Ching Chen, Kaohsiung City (TW); Shun-Ho Yang, Kaohsiung City (TW); Wei-Chen Chang, Kaohsiung City (TW); Chien-Li Huang, Kaohsiung City (TW); Chun-Chiang Wang, Kaohsiung City (TW)

(73) Assignees: King Slide Works Co., Ltd., Kaohsiung City (TW); King Slide Technology Co., Ltd., Kaohsiung City (TW)

( * ) Notice: Subject to any disclaimer, the term of this patent is extended or adjusted under 35 U.S.C. 154(b) by 312 days.

(21) Appl. No.: 18/346,978

(22) Filed: Jul. 5, 2023

(65) Prior Publication Data

US 2024/0240669 A1 Jul. 18, 2024

(30) Foreign Application Priority Data

Jan. 13, 2023 (TW) .................................. 112101922

(51) Int. Cl.
*A47B 88/423* (2017.01)
*H05K 7/14* (2006.01)
(52) U.S. Cl.
CPC ......... *A47B 88/423* (2017.01); *H05K 7/1489* (2013.01)

(58) Field of Classification Search
CPC ............................ A47B 88/423; H05K 7/1489
See application file for complete search history.

(56) References Cited

U.S. PATENT DOCUMENTS

| | | | | | |
|---|---|---|---|---|---|
| 5,669,512 | A | * | 9/1997 | Joslin ................... | H05K 7/1409 |
| | | | | | 211/41.17 |
| 6,883,884 | B2 | * | 4/2005 | Chen .................... | A47B 88/423 |
| | | | | | 312/334.44 |
| 6,915,562 | B2 | | 7/2005 | Joist et al. | |
| 7,125,272 | B1 | * | 10/2006 | Liang ................... | H05K 7/1489 |
| | | | | | 361/732 |
| 7,364,244 | B2 | * | 4/2008 | Sandoval ............. | H05K 7/1421 |
| | | | | | 312/334.46 |
| 8,403,432 | B2 | * | 3/2013 | Chen ..................... | A47B 88/43 |
| | | | | | 312/334.46 |
| 8,416,563 | B2 | * | 4/2013 | Hou ...................... | H05K 7/1489 |
| | | | | | 361/679.33 |
| 8,611,103 | B2 | * | 12/2013 | Thomas ............... | H05K 7/1489 |
| | | | | | 361/801 |
| 8,627,678 | B2 | * | 1/2014 | Choi ....................... | F25D 23/04 |
| | | | | | 62/344 |

(Continued)

FOREIGN PATENT DOCUMENTS

| | | | | | |
|---|---|---|---|---|---|
| CN | 208737366 U | * | 4/2019 | ........... | H05K 7/1489 |
| CN | 113597188 A | | 11/2021 | | |

(Continued)

*Primary Examiner* — Hanh V Tran
(74) *Attorney, Agent, or Firm* — Best & Flanagan LLP

(57) ABSTRACT

A slide rail assembly comprises a first rail, a second rail and a handle. When the handle is moved from a first operating position to a second operating position, the handle is configured to unlock the second rail relative to the first rail at a predetermined position.

12 Claims, 11 Drawing Sheets

(56)          References Cited

U.S. PATENT DOCUMENTS

| | | | | |
|---|---|---|---|---|
| 9,609,778 | B1 * | 3/2017 | Spencer | G06F 1/183 |
| 9,872,413 | B2 * | 1/2018 | Lin | H05K 7/1488 |
| 10,111,356 | B2 * | 10/2018 | Lindquist | H05K 7/1439 |
| 10,136,547 | B1 * | 11/2018 | Cecire | H05K 7/20736 |
| 10,292,493 | B2 * | 5/2019 | Chen | H05K 7/1489 |
| 10,349,742 | B2 * | 7/2019 | Chen | H02B 1/36 |
| 10,443,271 | B1 * | 10/2019 | Rose | E05C 3/16 |
| 10,568,230 | B1 * | 2/2020 | Yang | H05K 7/1489 |
| 10,869,404 | B2 * | 12/2020 | Yu | H05K 7/1489 |
| 10,939,573 | B1 * | 3/2021 | Liao | H01R 13/62983 |
| 11,197,389 | B2 * | 12/2021 | Lin | A47B 88/437 |
| 11,337,332 | B1 * | 5/2022 | An | H05K 5/0221 |
| 11,382,233 | B2 * | 7/2022 | Chang | H05K 7/1489 |
| 12,096,589 | B2 * | 9/2024 | Lin | H05K 7/1401 |
| 2009/0294393 | A1 | 12/2009 | Chen et al. | |
| 2011/0169389 | A1 | 7/2011 | Jeffries et al. | |
| 2022/0141985 | A1 | 5/2022 | Chang et al. | |
| 2022/0369478 | A1 | 11/2022 | Li et al. | |

FOREIGN PATENT DOCUMENTS

| | | | | |
|---|---|---|---|---|
| JP | H0165185 | U | * | 4/1989 |
| JP | 2004-031899 | A | | 1/2004 |
| TW | M612172 | U | * | 5/2021 |

\* cited by examiner

SLIDE RAIL ASSEMBLY

BACKGROUND OF THE INVENTION

1. Field of the Invention

The present invention relates to a slide rail assembly, and more particularly, to a slide rail assembly with a handle.

2. Description of the Prior Art

US Patent No. US 2022/0369478 A1 discloses a handle module arranged on a server. Furthermore, the handle module comprises a handle. The server is configured to be driven to move through contact between an abutting portion of the handle and an abutted portion of a rack.

However, in order to meet diverse requirements of the market, it is important to develop different products.

SUMMARY OF THE INVENTION

The present invention is to provide a slide rail assembly with a handle.

According to an embodiment of the present invention, a slide rail assembly comprises a first rail, a second rail and a handle. The second rail is movable relative to the first rail. The handle is movable relative to the second rail. When the handle is moved from a first operating position along a predetermined direction to a second operating position, the handle is configured to unlock the second rail relative to the first rail at a first predetermined position.

According to another embodiment of the present invention, a slide rail system comprises a carried object, a slide rail assembly and a handle. The slide rail assembly is configured to carry the carried object and comprises a supporting feature. The handle is movably mounted to the carried object. During a process of the handle being moved from one operating position to another operating position, the handle is configured to continuously contact the supporting feature, in order to move the carried object from a first predetermined position to a second predetermined position.

According to another embodiment of the present invention, a slide rail assembly comprises a first rail, a second rail and a handle. The second rail is movable relative to the first rail. The handle is movably mounted to the second rail. A supporting feature is arranged on the first rail. The handle comprises a first corresponding section. When the handle is moved from one operating position to another operating position, the handle is configured to contact the supporting feature through the first corresponding section, in order to move the second rail from a first predetermined position to a second predetermined position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
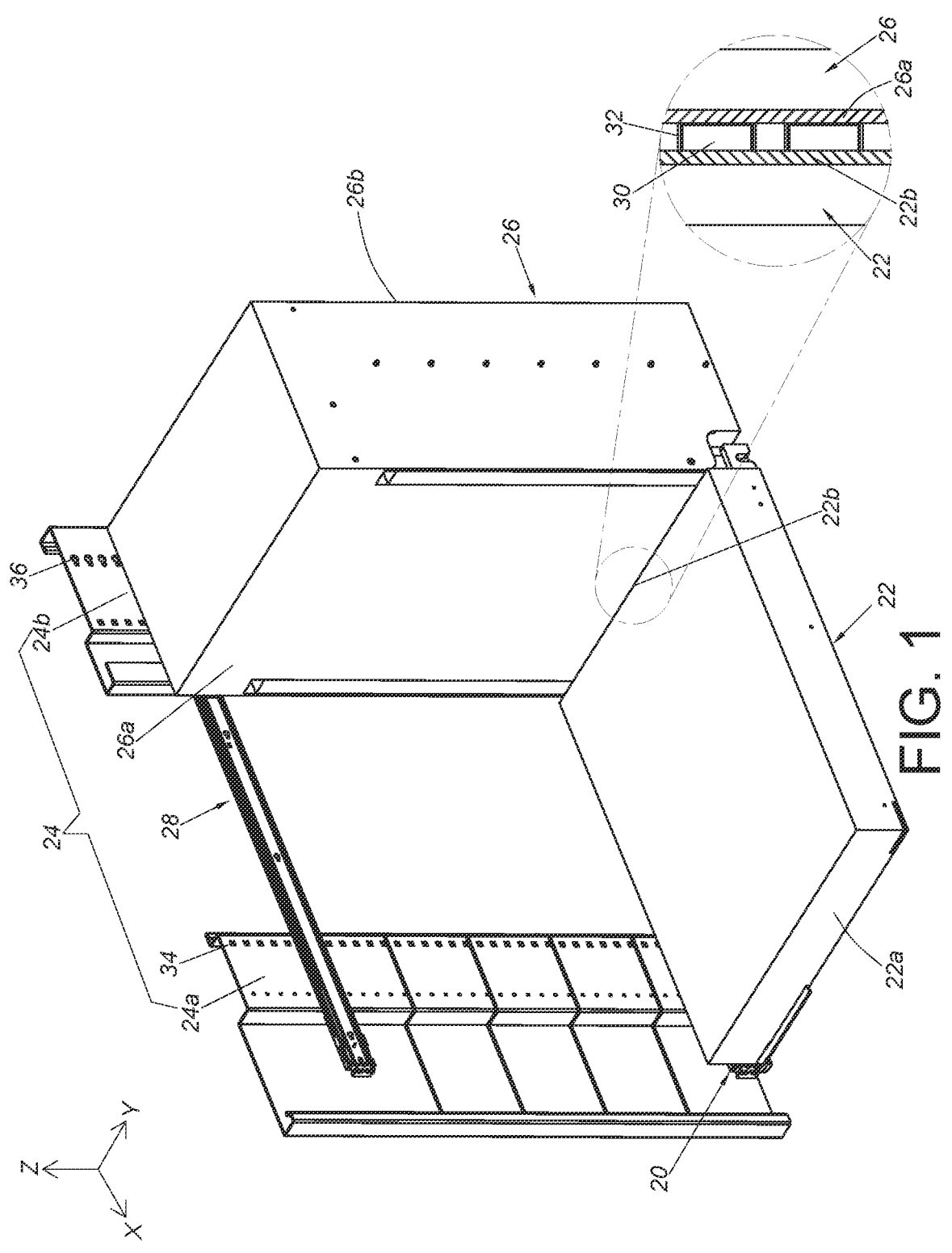
FIG. 1 is a diagram showing a slide rail assembly configured to mount a carried object to a rack according to a first embodiment of the present invention.
Figure 2:
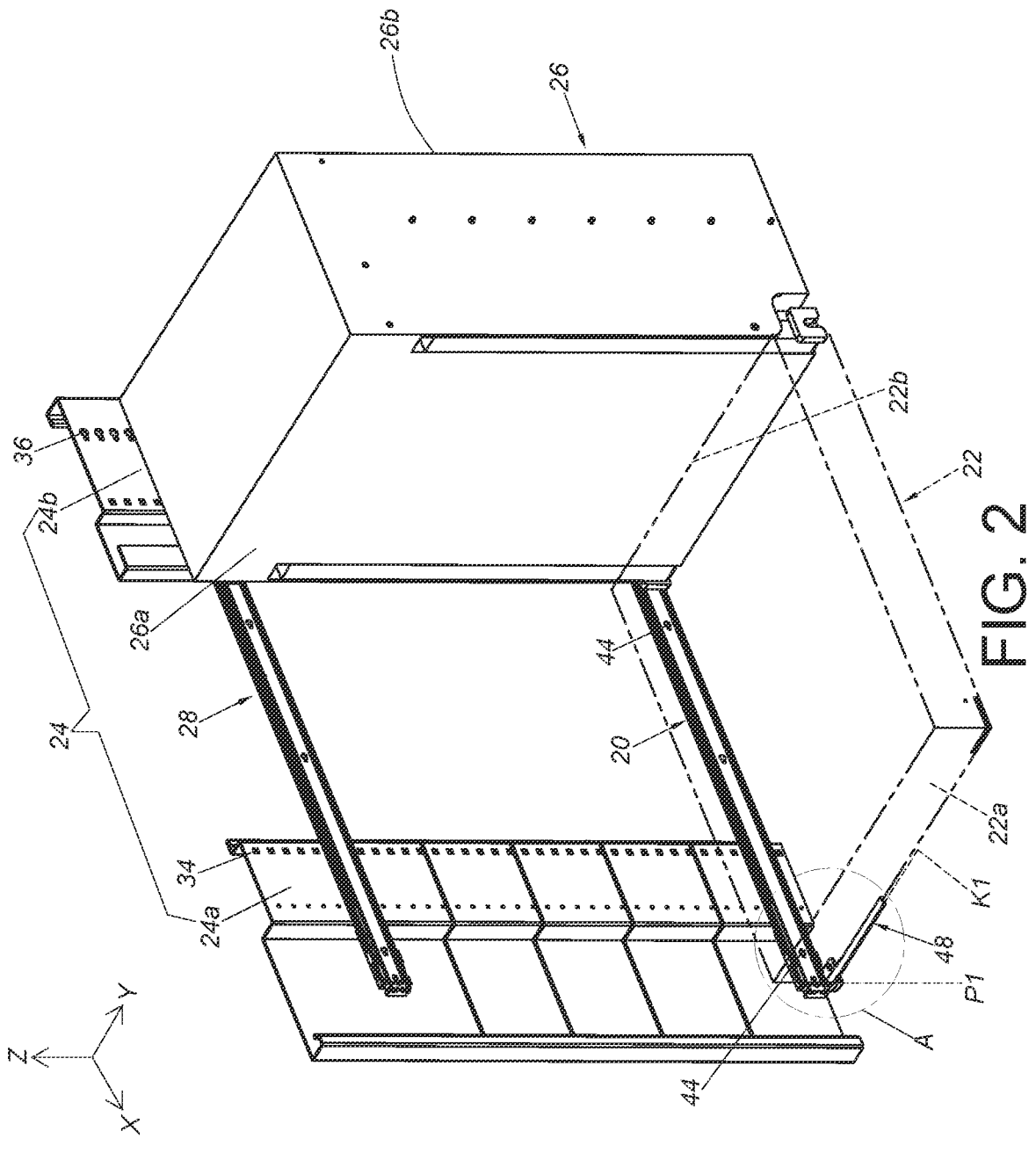
FIG. 2 is a diagram showing the slide rail assembly configured to mount the carried object to the rack according to the first embodiment of the present invention.

As shown in FIG. 1 and FIG. 2, a slide rail assembly 20 is configured to mount a carried object 22 (such as a first carried object or a front carried object) to a rack 24 according to a first embodiment of the present invention. In the present embodiment, the rack 24 comprises a front post 24a and a rear post 24b, but the present invention is not limited thereto. In the present embodiment, the rack 24 is further mounted with another carried object 26 (such as a second carried object or a rear carried object). Specifically, the second carried object 26 is configured to be mounted to the rack through the slide rail assembly 20 and/or another slide rail assembly 28. The first carried object 22 has a front part 22a and a rear part 22b, and the second carried object 26 has a front part 26a and a rear part 26b.

Preferably, the first carried object 22 has at least one first connecting member 30 (such as a plurality of first connecting members 30), and the second carried object 26 has at least one second connecting member 32 (such as a plurality of second connecting members 32). The first connecting members 30 and the second connecting members 32 can be plugs, sockets or the like (as shown in FIG. 1). In the present embodiment, the rear part 22b of the first carried object 22 is arranged with the first connecting member 30, and the front part 26a of the second carried object 26 is arranged with the second connecting member 32, but the present invention is not limited thereto. In other alternative embodiments, the first connecting member 30 can be arranged at any position on the first carried object 22, and the second connecting member 32 can be arranged at one position on the second carried object 26 corresponding to the first connecting member 30.

Preferably, when the slide rail assembly 20 is in a retracted state, the first connecting member 30 on the rear part 22b of the first carried object 22 and the second connecting member 32 on the front part 26a of the second carried object 26 are configured be connected with each other (as shown in FIG. 1).

Preferably, the rack 24 comprises a plurality of mounting features, such as a plurality of first mounting features 34 and a plurality of second mounting features 36 configured to mount the two slide rail assemblies 20, 28.

Figure 3:
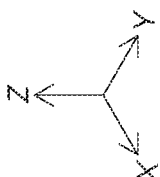
FIG. 3 is an enlarged view of an area A of FIG. 2.

As shown in FIGS. 2 and 3, the slide rail assembly 20 comprises a first rail 38 and a second rail 40 longitudinally movable relative to the first rail 38. Preferably, the slide rail assembly 20 further comprises a third rail 41 movably mounted between the first rail 38 and the second rail 40. In the present embodiment, the X axis is a longitudinal direction (or a length direction or a moving direction of the slide rail), the Y axis is a transverse direction (or a lateral direction of the slide rail), and the Z axis is a vertical direction (or a height direction of the slide rail). The first rail 38 is mounted to the rack 24. In the present embodiment, the first rail 38 is arranged with a supporting frame 42, and the first rail 38 is fixedly mounted to the rack 24 through the supporting frame 42. Preferably, the supporting frame 42 and the first rail 38 are fixedly connected to each other and can be seen as one piece. Furthermore, the first rail 38 or the supporting frame 42 has a plurality of corresponding features configured to be mounted to the mounting features 34, 36 of the rack 24. On the other hand, the second rail 40 has at least one mounting part 44 configured to mount the first carried object 22, that is, the second rail 40 is configured to carry the first carried object 22.

The slide rail assembly 20 further comprises a handle 48. When the slide rail assembly 20 is in the retracted state, a locking member (not shown in figures) is configured to lock the second rail 40 (and the first carried object 22) at a first predetermined position P1 (such as a retracted position) relative to the first rail 38. For example, the locking member is movably arranged on the second rail 40, and the first rail 38 (or the supporting frame 42) comprises a blocking feature (not shown in figures) configured to lock the locking member. The second rail 40 is configured to be temperately locked at a predetermined position through the locking member. Such configuration is well known to those skilled in the art, for simplification, no further illustration is provided.

The handle 48 is movable relative to the second rail 40. In the first embodiment, the handle 48 is movably mounted to the first carried object 22, such that the handle 48 is movable relative to the second rail 40. Furthermore, the handle 48 is pivotally connected to a bottom part of the first carried object 22 through a shaft member 50, but the present invention is not limited thereto. The shaft member 50 is arranged in a direction substantially identical to the height direction of the slide rail assembly 20.

Preferably, the slide rail assembly 20 further comprises a supporting feature 52 arranged on the supporting frame 42 of the first rail 38, and the supporting feature 52 comprises a first wall 52a (such as a front wall) and a second wall 52b (such as a rear wall). In the present embodiment, the supporting feature 52 is a protrusion. In other alternative embodiments, the supporting feature 52 can be a wall, therefore, the embodiments of the present invention is not limited thereto. On the other hand, the handle 48 comprises a first corresponding section 54 and a second corresponding section 56.

Preferably, the handle 48 further comprises an operating part 58 and a working part 60. The working part 60 is located adjacent to one end of the operating part 58, and the first corresponding section 54 and the second corresponding section 56 are arranged on the working part 60 of the handle 48. In addition, a predetermined space is defined between the first corresponding section 54 and the second corresponding section 56. When the second rail 40 (and the first carried object 22) is located at the first predetermined position P1, and when the handle 48 is located at a first operating position K1, the supporting feature 52 is located in the predetermined space.

Preferably, the slide rail assembly 20 further comprises an actuating member 62 movably mounted to a housing 64 on the second rail 40. The actuating member 62 is partially exposed outside the housing 64, and the actuating member 62 is configured to interact with the locking member.

Figure 4:
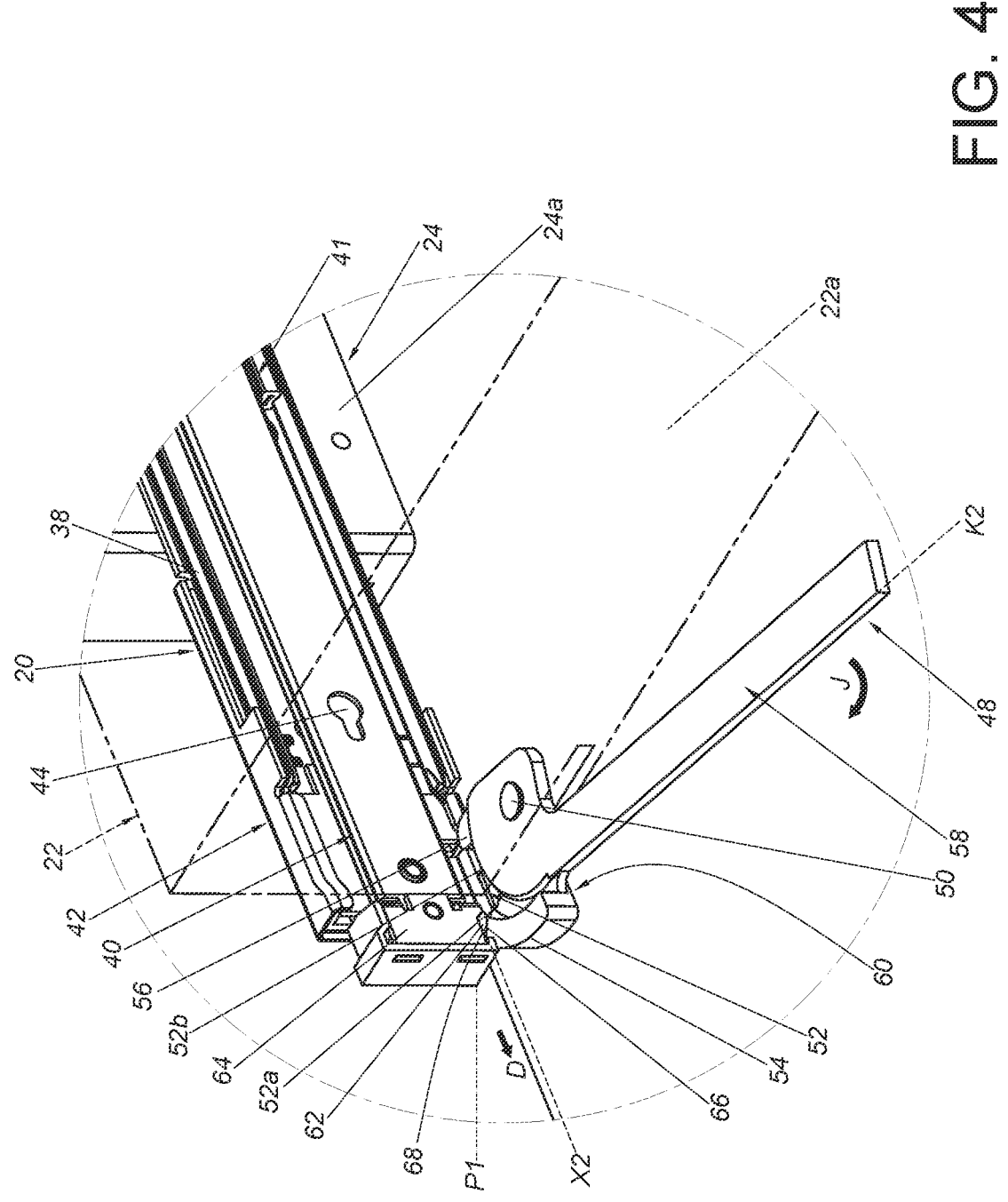
FIG. 4 is a diagram showing a handle configured to unlock a second rail relative to a first rail at a predetermined position according to the first embodiment of the present invention.

As shown in FIG. 3 and FIG. 4, a user can apply a force to the operating part 58 of the handle 48 to move the handle 48 from the first operating position K1 (as shown in FIG. 3) along a predetermined direction J to a second predetermined position K2 (as shown in FIG. 4), such that the handle 48 is configured to unlock the second rail 40 to allow the second rail 40 (and the first carried object 22) to move relative to the first rail 38 from the first predetermined position P1 along an opening direction D.

Preferably, when the handle 48 is moved from the first operating position K1 along the predetermined direction J to the second operating position K2, the handle 48 is configured to drive the actuating member 62 to move from an initial position X1 (as shown in FIG. 3) to an non-initial position X2 (as shown in FIG. 4), such that the actuating member 62 further drives the locking member to move in order to unlock the second rail 40 relative to the first rail 38.

Preferably, when the handle 48 is moved from the first operating position K1 along the predetermined direction J to the second operating position K2, the handle 48 is configured to drive the actuating member 62 to move from the initial position X1 (as shown in FIG. 3) to the non-initial position X2 (as shown in FIG. 4) through the first corresponding section 54.

Preferably, the first corresponding section 54 of the handle 48 and/or the actuating member 62 has a guiding surface, such as an inclined surface or an arc surface, such that the handle 48 can easily drive the actuating member 62 to move from the initial position X1 (as shown in FIG. 3) to the non-initial position X2 (as shown in FIG. 4). In the present embodiment, the first corresponding section 54 has a first guiding surface 66, and the actuating member 62 has a second guiding surface 68, but the present invention is not limited thereto.

Moreover, when the handle 48 is located at the second operating position K2, the first corresponding section 54 of the handle 48 is moved toward the first wall 52a of the supporting feature 52 (as shown in FIG. 4).

Figure 5:
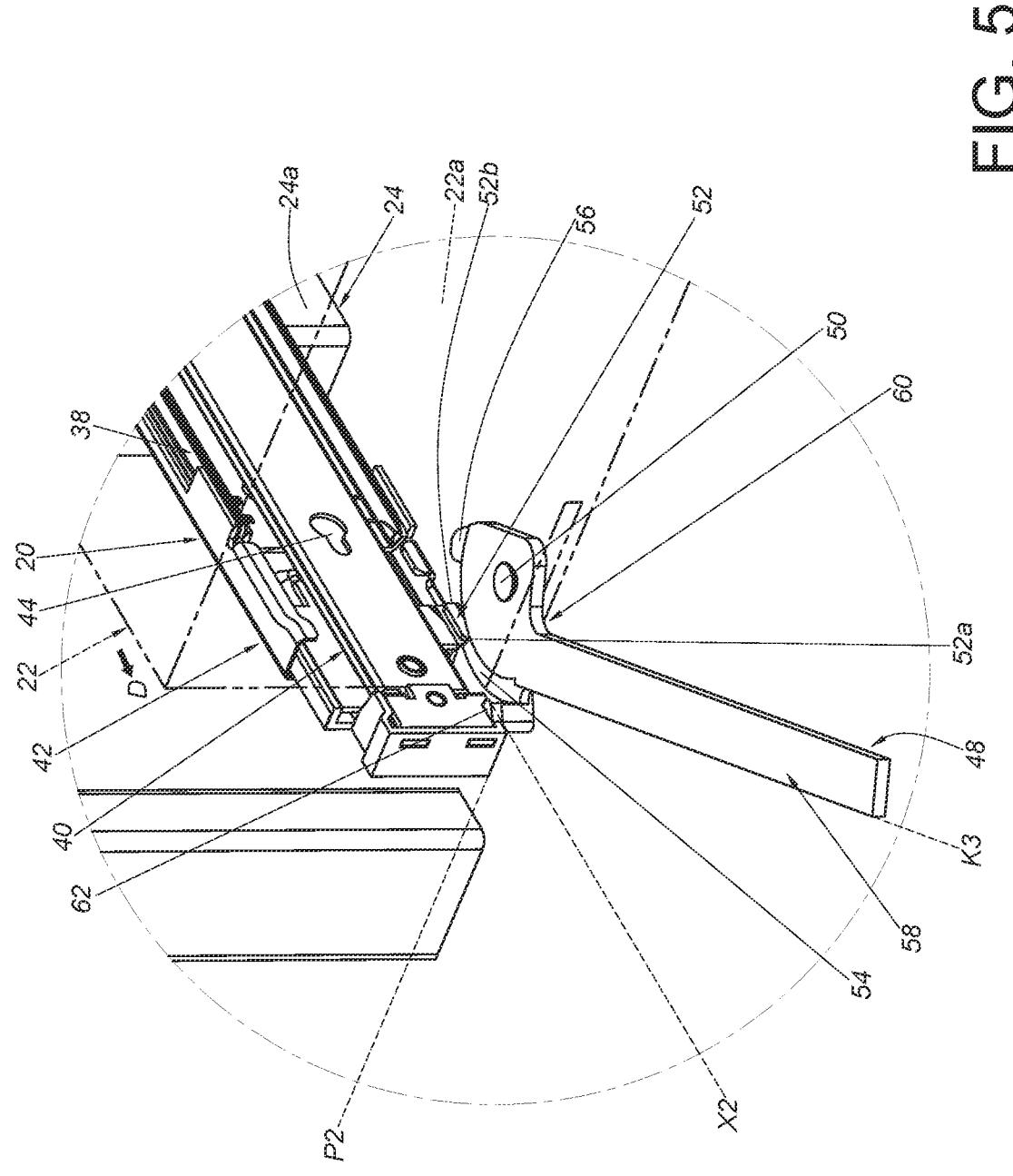
FIG. 5 is a diagram showing the handle configured to interact with a supporting feature to drive the second rail to move away from the predetermined position according to the first embodiment of the present invention.
Figure 6:
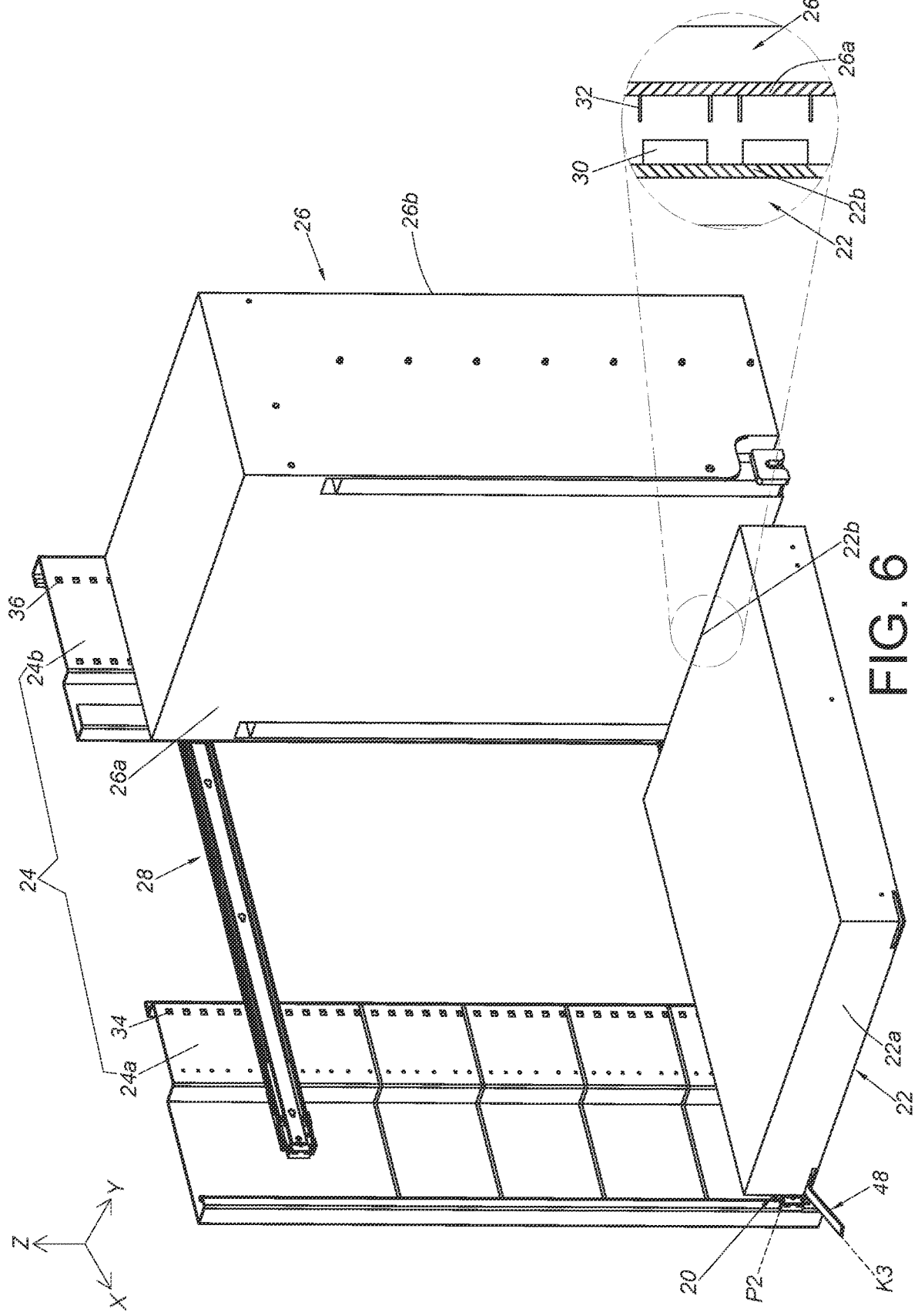
FIG. 6 is a diagram showing the second rail being moved away from the predetermined position to disconnect the carried object from another carried object according to the first embodiment of the present invention.

As shown in FIG. 4, FIG. 5 and FIG. 6, during a process of the handle 48 being further moved from the second operating position K2 along the predetermined direction J to a third operating position K3, the handle 48 continuously contacts the supporting feature 52 (the first wall 52a of the supporting feature 52) through the first corresponding section 54 to generate an acting force, so that the second rail 40 can be moved from the first predetermined position P1 (as shown in FIG. 4) along the opening direction D to a second predetermined position P2 (as shown in FIG. 5 and FIG. 6) in response to the acting force. Accordingly, the first connecting member 30 of the first carried object 22 and the second connecting member 32 of the second carried object 26 are no longer connected with each other and are separated from each other (as shown in FIG. 6).

Therefore, during the process of the handle 48 being moved from the second operating position K2 to the third operating position K3, the first corresponding section 54 of the handle 48 can use the supporting feature 52 of the slide rail assembly 20 as a supporting point to move the second rail 40 from the first predetermined position P1 (as shown in FIG. 4) along the opening direction D to the second predetermined position P2 (as shown in FIG. 5 and FIG. 6), such that the user can easily disconnect the first connecting member 30 of the first carried object 22 from the second connecting member 32 of the second carried object 26 in order to separate the first carried object 22 and the second carried object 26 from each other (as shown in FIG. 6).

Figure 7:
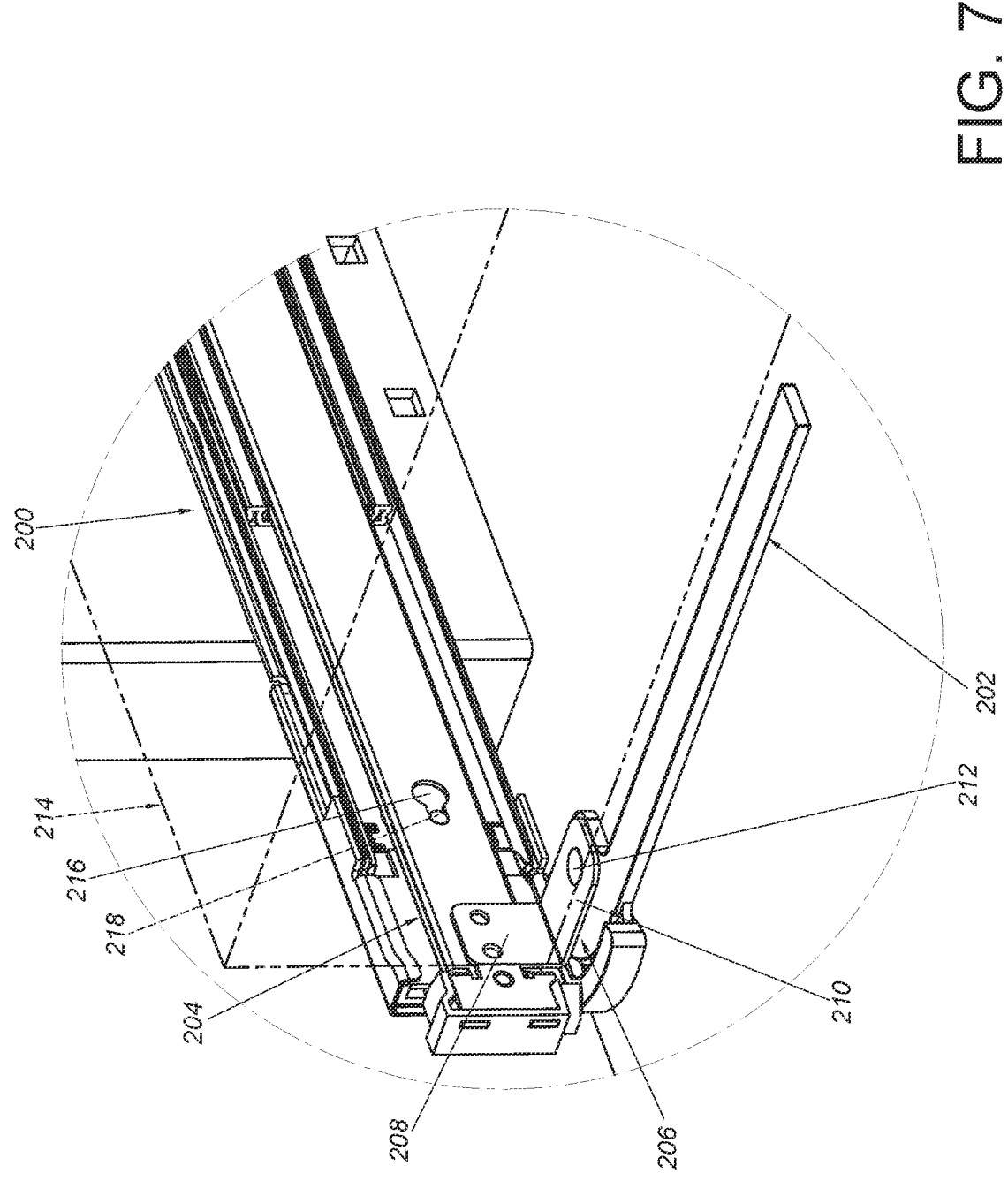
FIG. 7 is a diagram showing a slide rail assembly configured to mount a carried object to a rack according to a second embodiment of the present invention.

FIG. 7 is a diagram showing a slide rail assembly 200 according to a second embodiment of the present invention. Moreover, different from the slide rail assembly 20 of the first embodiment having the handle 48 movably mounted to the first carried object 22, the slide rail assembly 200 of the second embodiment has a handle 202 movably mounted to a second rail 204. According to such configuration, the second embodiment can achieve substantially identical technical effect as the first embodiment.

Preferably, the second rail 204 is arranged with an auxiliary member 206, and the auxiliary member 206 comprises a first part 208 and a second part 210 bent relative to the first part 208.

Preferably, the first part 208 and the second part 210 of the auxiliary member 206 are substantially perpendicularly connected to each other. The first part 208 is connected (such as fixedly connected) to the second rail 204, and the handle 202 is pivotally connected to the second part 210 through a shaft member 212.

Preferably, the second rail 204 is configured carry a carried object (such as a first carried object 214). For example, the second rail 204 has at least one mounting part 216 configured to mount a corresponding mounting part 218 of the first carried object 214. In addition, other configurations of the slide rail assembly 200 of the second embodiment are identical to those of the slide rail assembly 20 of the first embodiment, for simplification, no further illustration is provided.

Figure 8:
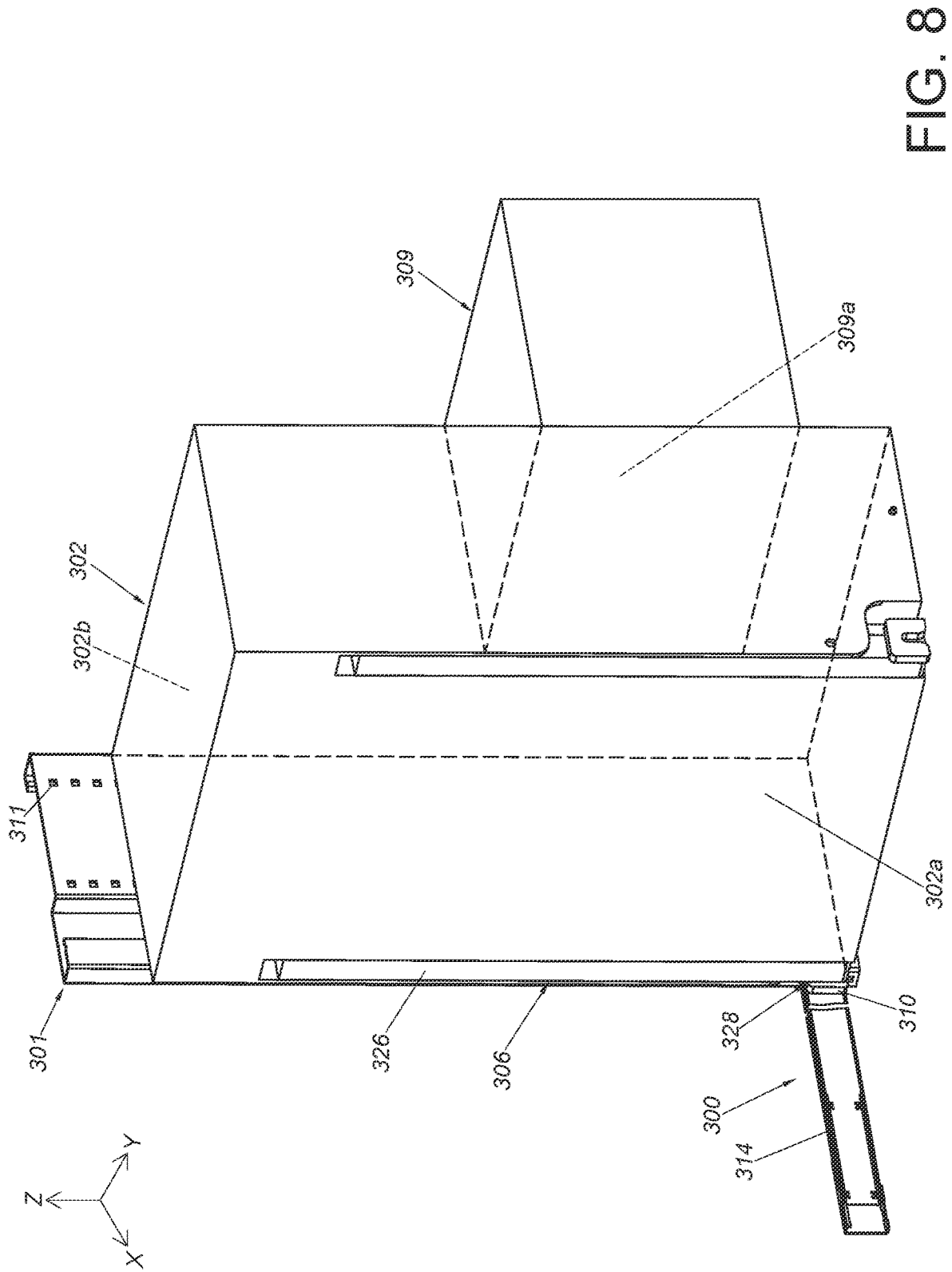
FIG. 8 is a diagram showing a slide rail assembly configured to mount a carried object to a rack with the carried object being connected to an auxiliary object according to a third embodiment of the present invention.
Figure 9:
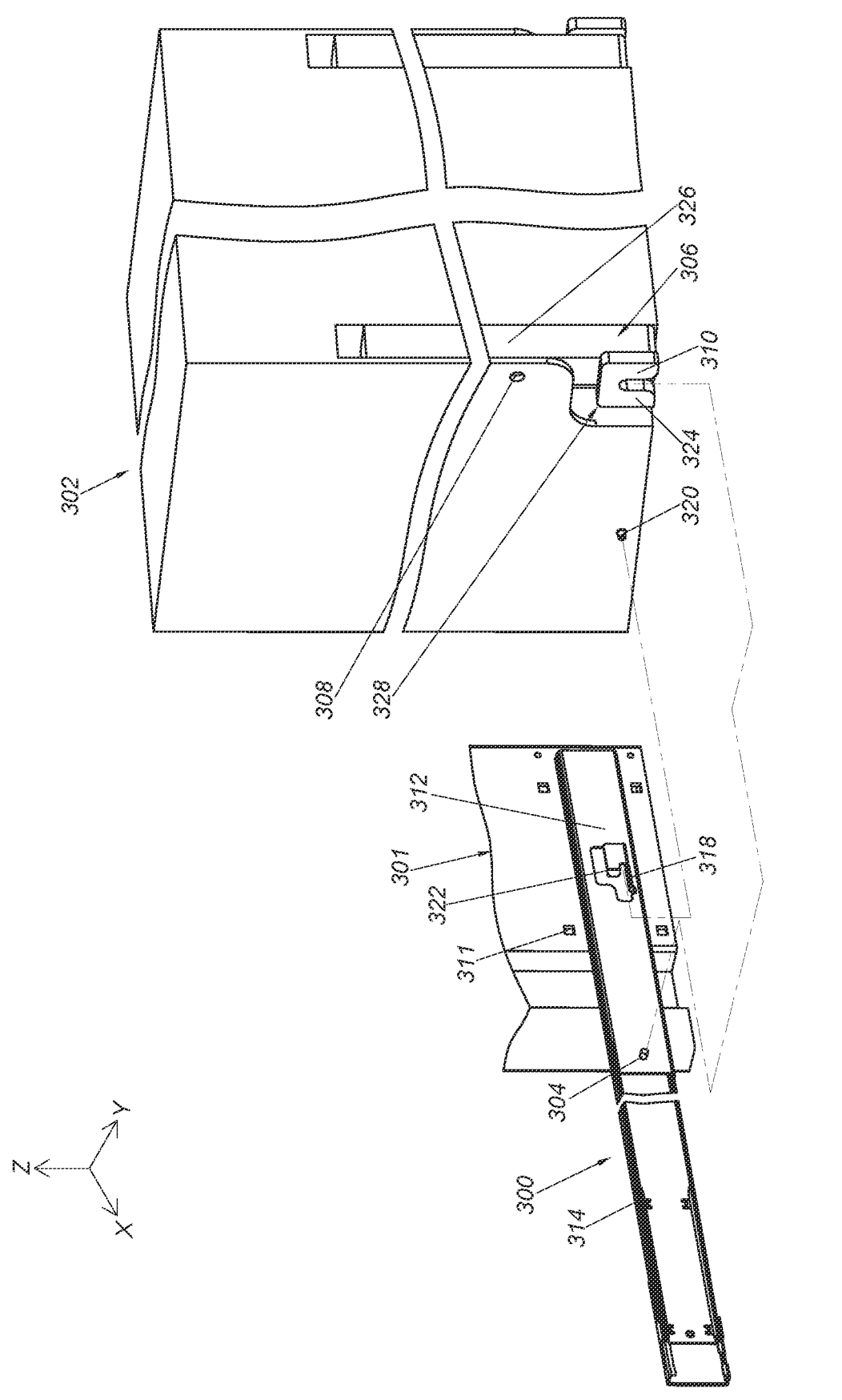
FIG. 9 is an exploded view of the slide rail assembly and the carried object with the slide rail assembly being mounted to the rack according to the third embodiment of the present invention.

FIG. 8 and FIG. 9 are diagrams showing a slide rail assembly 300 applicable to a rack 301 and configured to carry a carried object 302 according to a third embodiment of the present invention. The slide rail assembly 300 comprises a supporting feature 304. A handle 306 is movably mounted to the carried object 302. Different from the handle 48 of the first embodiment being pivotally connected to the bottom part of the carried object, the handle 306 of the third embodiment is pivotally connected to a lateral part of the carried object 302 through a shaft member 308. In addition, the shaft member 308 is arranged in a direction substantially identical to a transverse direction (or a lateral direction) of the slide rail assembly 300. Preferably, the handle 306 comprises a first corresponding section 310.

Figure 10:
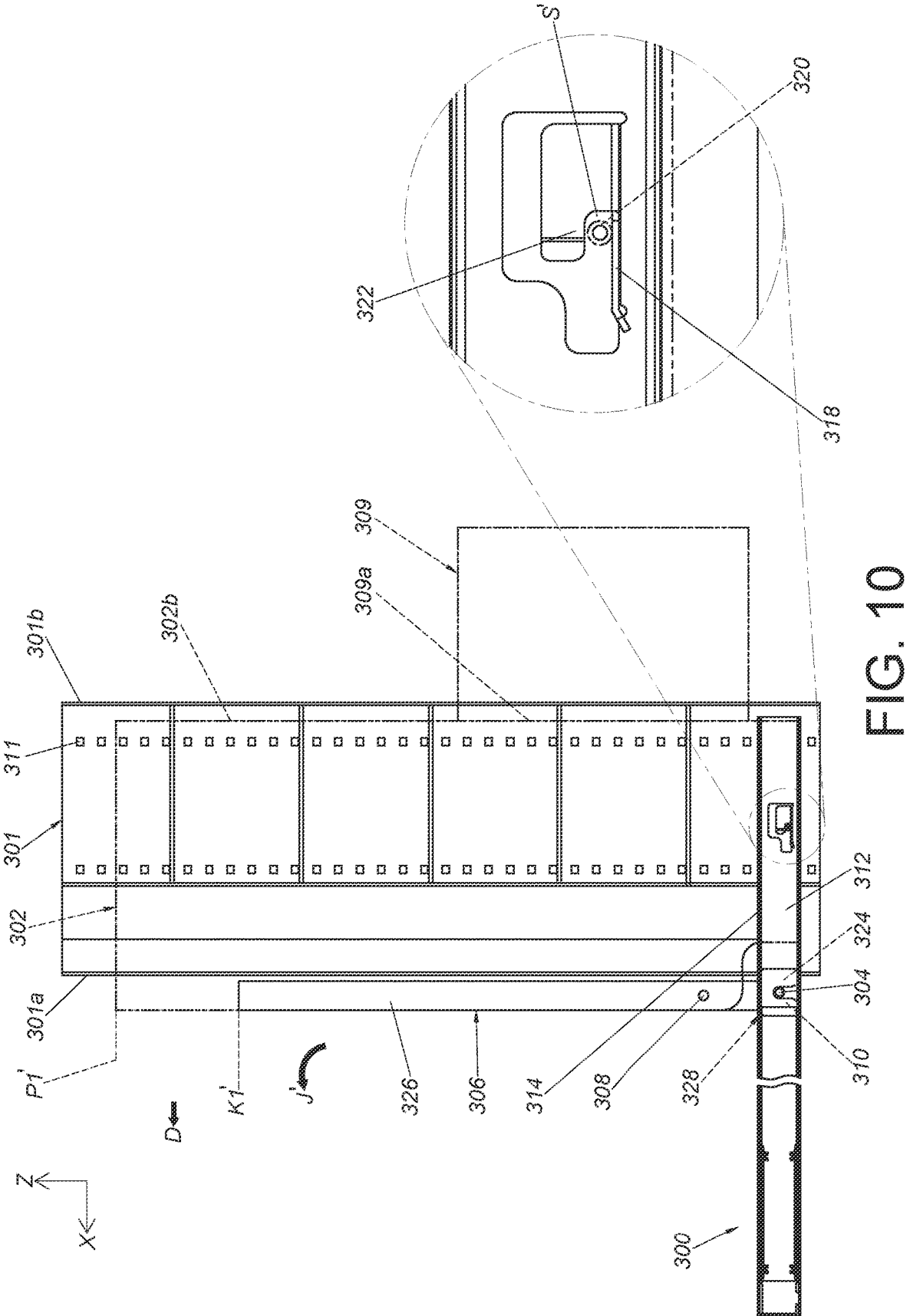
FIG. 10 is a diagram showing the carried object being mounted to the rack and located at a predetermined position through the slide rail assembly according to the third embodiment of the present invention.
Figure 11:
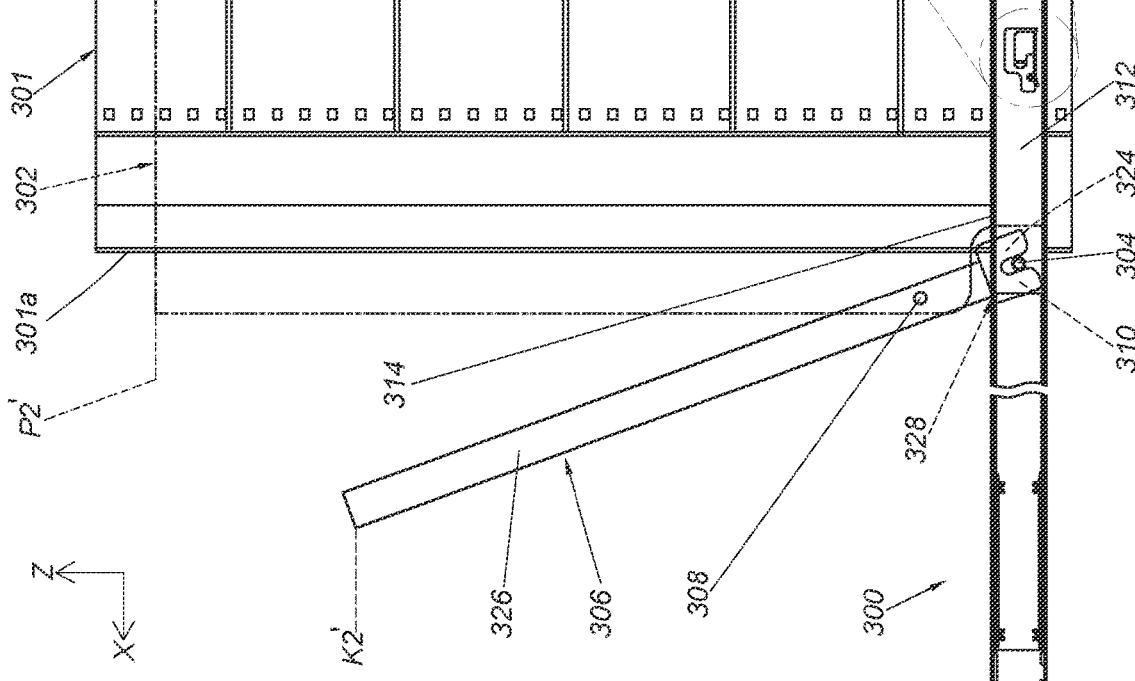
FIG. 11 is a diagram showing a handle configured to interact with a supporting feature to drive the carried object to move away from the predetermined position to disconnect the carried object from the auxiliary object according to the third embodiment of the present invention.

As shown in FIG. 10 and FIG. 11, the rack 301 has a front end 301a and a rear end 301b, and an auxiliary object 309 is arranged adjacent to the rear end 301b of the rack 301. When the carried object 302 is located at a first predetermined position P1' (such as a retracted position as shown in FIG. 10), a first connecting member of the carried object 302 (a rear part 302b of the carried object 302) and a second connecting member of the auxiliary object 309 (a front part 309a of the auxiliary object 309) can be connected with each other. (such connection configuration between the first connecting member and the second connecting member can refer to FIG. 1, for simplification, no further illustration is provided.)

During a process of the handle 306 being moved from one operating position K1' (as shown in FIG. 10) along a predetermined direction J' to another operating position K2' (as shown in FIG. 11), the handle 306 continuously contacts the supporting feature 304 through the first corresponding section 310 to generate an acting force, such that the carried object 302 can be moved from the first predetermined position P1' (as shown in FIG. 10) along the opening direction D to a second predetermined position P2' (as shown in FIG. 11) in response to the acting force. Accordingly, the first connecting member of the carried object 302 and the second connecting member of the auxiliary member 309 are no longer connected with each other and are separated from each other (such disconnection configuration between the first connecting member and the second connecting member can refer to FIG. 6, for simplification, no further illustration is provided.)

Preferably, the slide rail assembly 300 comprises a first rail 312, and the first rail 312 is fixedly mounted to the rack 301 through a supporting frame 314. Preferably, the supporting frame 314 and the first rail 312 are fixedly connected to each other and can be seen as one piece. Furthermore, the rack 301 comprises a plurality of mounting features 311 configured to mount the slide rail assembly 300 (the supporting frame 314 of the slide rail assembly 300). On the other hand, an upper part of the carried object 302 is configured to be mounted to the rack 301 through another slide rail assembly (not shown in the figures), such that the carried object 302 is longitudinally slidable relative to the rack 301.

Preferably, the supporting feature 304 is arranged on one of the supporting frame 314 and the first rail 312. In the present embodiment, the supporting feature 304 is arranged on the first rail 312.

Preferably, one of the supporting frame 314 and the first rail 312 is arranged with a supporting part 318, and the supporting part 318 has a first predetermined longitudinal length. In the present embodiment, the first rail 312 is arranged with the supporting part 318, and the carried object 302 is arranged with a supporting member 320 configured to be supported by the supporting part 318. In the present embodiment, the supporting member 320 is a protrusion or cylinder, but the present invention is not limited thereto.

Preferably, one of the supporting frame 314 and the first rail 312 is further arranged with an extension wall 322, and the extension wall 322 has a second predetermined longitudinal length shorter than the first predetermined longitudinal length of the supporting part 318. In the present embodiment, the first rail 312 is arranged with the extension wall 322. An accommodating space S' is defined between the extension wall 322 and the supporting part 318, and configured to accommodate the supporting member 320 of the carried object 302.

Preferably, when the carried object 302 is located at the first predetermined position P1', the supporting member 320 can be accommodated in the accommodating space S', and the supporting member 320 is configured to be blocked by a wall at an edge of the accommodating space S', in order to limit movement of the carried object 302 (as shown in FIG. 10).

Preferably, the handle 306 further comprises a second corresponding section 324. In addition, a predetermined space is defined between the first corresponding section 310 and the second corresponding section 324. When the carried object 302 is located at the first predetermined position P1' and when the handle 306 is located at the operating position K1' (as shown in FIG. 10), the supporting feature 304 is located in the predetermined space.

Preferably, the handle 306 further comprises an operating part 326 and a working part 328. The working part 328 is located adjacent to one end of the operating part 326, and the first corresponding section 310 and the second corresponding section 324 are arranged on the working part 328 of the handle 306.

Therefore, the slide rail assembly according to the embodiments of the present invention has the following technical features:

1. The handle 48 is configured to unlock the second rail 40 relative to the first rail 38 at a first predetermined position P1.

2. The supporting feature (52, 304) on the slide rail assembly (20, 200, 300) can be used as a supporting point to assist the handle (48, 202, 306) in driving the second rail (40, 204) or the carried object (22, 214, 302) to move from the first predetermined position (P1, P1') to the second predetermined position (P2, P2').

3. The handle (48, 306) is movably mounted to the carried object (22, 302); or the handle 202 is movably mounted to the slide rail.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:

a first rail;

a second rail movable relative to the first rail;

an actuating member movably mounted on the second rail;

a supporting feature arranged on the first rail; and a handle movable relative to the second rail;

wherein when the handle is moved from a first operating position along a predetermined direction to a second operating position, the handle is configured to drive the actuating member to move relative to the handle and the second rail in order to unlock the second rail relative to the first rail at a first predetermined position;

wherein during a process of the handle being moved from the second operating position along the predetermined direction to a third operating position, the handle is configured to continuously contact the supporting feature, in order to move the second rail from the first predetermined position to a second predetermined position;

wherein the handle has a first guiding surface, and the actuating member has a second guiding surface, at least one of the first guiding surface and the second guiding surface is an inclined surface or an arc surface;

wherein when the handle is located at the first operating position, the first guiding surface does not contact with the second guiding surface; wherein when the handle is located at the second operating position, the first guiding surface is configured to contact with the second guiding surface.

2. The slide rail assembly of claim 1, wherein the second rail is configured to carry a carried object, and the handle is movably mounted to the carried object.

3. The slide rail assembly of claim 1, wherein the handle comprises a first corresponding section; wherein the handle is configured to continuously contact the supporting feature through the first corresponding section, in order to move the second rail from the first predetermined position to the second predetermined position.

4. The slide rail assembly of claim 3, wherein the handle further comprises a second corresponding section, and a predetermined space is defined between the second corresponding section and the first corresponding section; wherein when the second rail is located at the first predetermined position and when the handle is located at the first operating position, the supporting feature is located in the predetermined space.

5. The slide rail assembly of claim 3, wherein the first rail is arranged with a supporting frame, and the first rail is mounted to a rack through the supporting frame.

6. The slide rail assembly of claim 5, wherein the supporting feature is arranged on the supporting frame.

7. The slide rail assembly of claim 2, wherein the handle is movable relative to the second rail in a pivotal manner.

8. A slide rail system, comprising:

a carried object;

a slide rail assembly configured to carry the carried object, the slide rail assembly comprising a first rail, a second rail, an actuating member movably mounted on the second rail, and a supporting feature arranged on the first rail; and a handle movably mounted to the carried object;

wherein during a process of the handle being moved from a first operating position to a second operating position, the handle is configured to drive the actuating member to move relative to the handle and the second rail in order to unlock the second rail relative to the first rail at a first predetermined position; and wherein during a process of the handle being moved from the second operating position to a third operating position, the handle is configured to continuously contact the supporting feature, in order to move the carried object from a first predetermined position to a second predetermined position;

wherein the handle has a first guiding surface, and the actuating member has a second guiding surface, at least one of the first guiding surface and the second guiding surface is an inclined surface or an arc surface;

wherein when the handle is located at the first operating position, the first guiding surface does not contact with the second guiding surface; wherein when the handle is located at the second operating position, the first guiding surface is configured to contact with the second guiding surface.

9. The slide rail system of claim 8, wherein the first rail is fixedly mounted to a rack.

10. The slide rail system of claim 8, wherein the first rail is arranged with a supporting part, and the carried object is arranged with a supporting member configured to be supported by the supporting part.

11. The slide rail system of claim 10, wherein the first rail is further arranged with an extension wall, and an accommodating space is defined between the extension wall and the supporting part.

12. The slide rail system of claim 11, wherein when the carried object is located at the first predetermined position, the supporting member of the carried object is configured to be accommodated in the accommodating space.

\* \* \* \* \*